US006913471B2

(12) United States Patent
Smith

(10) Patent No.: US 6,913,471 B2
(45) Date of Patent: Jul. 5, 2005

(54) OFFSET STACKABLE PASS-THROUGH SIGNAL CONNECTOR

(75) Inventor: Michael G. Smith, Tustin, CA (US)

(73) Assignee: Gateway Inc., Irvine, CA (US)

( * ) Notice: Subject to any disclaimer, the term of this patent is extended or adjusted under 35 U.S.C. 154(b) by 0 days.

(21) Appl. No.: 10/292,871

(22) Filed: Nov. 12, 2002

(65) Prior Publication Data

US 2004/0092138 A1 May 13, 2004

(51) Int. Cl.[7] .................. H01R 12/00; H01R 13/60; H01R 13/66; H05K 1/00
(52) U.S. Cl. .................. 439/74; 439/75; 439/541.5
(58) Field of Search .................. 439/74, 75, 541.5

(56) References Cited

U.S. PATENT DOCUMENTS

| | | | | |
|---|---|---|---|---|
| 3,663,931 A | * | 5/1972 | Brown | 439/75 |
| 4,106,838 A | | 8/1978 | Jayne | |
| 4,158,220 A | | 6/1979 | Yamamoto et al. | |
| 4,538,877 A | | 9/1985 | Novis | |
| 4,735,516 A | | 4/1988 | Galarneau | |
| 4,806,105 A | | 2/1989 | Muzslay | |
| 5,080,609 A | | 1/1992 | Fabian et al. | |
| 5,176,523 A | | 1/1993 | Lai | |
| 5,201,038 A | | 4/1993 | Fielder | |
| 5,267,876 A | | 12/1993 | Rupert | |
| 5,295,871 A | * | 3/1994 | Lapraik et al. | 439/746 |
| 5,334,046 A | | 8/1994 | Brouillette et al. | |
| 5,472,358 A | * | 12/1995 | Tan et al. | 439/851 |
| 5,613,033 A | * | 3/1997 | Swamy et al. | 361/790 |
| 5,637,006 A | * | 6/1997 | Almeras | 439/191 |
| 5,908,335 A | * | 6/1999 | Satoh | 439/857 |
| 5,963,464 A | | 10/1999 | Dell et al. | |
| 5,967,799 A | | 10/1999 | Arai | |
| 6,141,221 A | | 10/2000 | Tong et al. | |
| 6,171,138 B1 | | 1/2001 | Lefebvre et al. | |
| 6,210,214 B1 | | 4/2001 | Chang | |
| 6,234,833 B1 | | 5/2001 | Tsai et al. | |
| 6,238,240 B1 | | 5/2001 | Yu | |
| 6,533,587 B1 | * | 3/2003 | Potter et al. | 439/65 |

FOREIGN PATENT DOCUMENTS

| | | |
|---|---|---|
| EP | 0 213 205 | 3/1987 |
| EP | 0 845 837 | 11/1997 |
| JP | 03266379 | 11/1991 |
| JP | 06337329 | 12/1994 |
| WO | WO 94/19844 | 9/1994 |

* cited by examiner

*Primary Examiner*—Chandrika Prasad
(74) *Attorney, Agent, or Firm*—Jeffrey A. Proehl; Ross F. Hunt, Jr.; Stites and Harbison

(57) ABSTRACT

A stackable pass-through signal connector comprises an array of first connection elements and an array of second connection elements. The second connection elements are physically aligned with the array of first connection elements, and the second connection elements are, operable to electrically couple with first connection elements of another stackable non-shared signal connector. Interconnections between the first connection elements and the second connection elements connect first connection elements that are electrically offset from the second connection elements of the stackable non-shared signal connector.

18 Claims, 4 Drawing Sheets

OFFSET STACKABLE PASS-THROUGH SIGNAL CONNECTOR

FIELD OF THE INVENTION

The invention relates generally to electric connectors, and more specifically to a stackable offset electric signal connector.

BACKGROUND OF THE INVENTION

Modern electronic devices rely upon interconnection of various components to form circuits. These electronic components are typically mounted on printed circuit boards, which have copper traces routed along and within the circuit board that provide electrical connections between components mounted to the circuit board. Even with the ever-shrinking size of electronic components and the common use of circuit boards with several layers of copper conductors, increased circuit density is still desired for some applications such as personal computers, cellular telephones, and other such devices.

One way that this increased circuit density can be accomplished is by using multiple printed circuit boards connected to each other. The various boards containing parts of an electronic circuit or device can be interconnected via cables, such as a ribbon cable attached to two different circuit boards, or by connectors attached to the circuit boards that can connect directly to each other. Such electrical connectors can serve to both electrically and physically attach one circuit board to another, allowing two or more printed circuit boards to be mounted parallel to and directly above or below to each other.

Such a technique facilitates use of irregular spaces inside an electronic device, where the circuit board area available in two dimensions might be limited but the volume in three dimensions is relatively large. A series of smaller, stacked circuit boards will enable efficient use of such space, and provide the increased circuit density desired.

Also, a stacked circuit board connection system allows easy addition or upgrade of various circuit components. For example, a home theater audiovisual receiver might have plenty of space available in the chassis for various circuits, but can utilize a stackable, removable printed circuit board circuit module that can be easily removed and replaced to provide upgrades to the latest surround sound functionality and standards.

Stacked circuit board connector systems are particularly well suited to applications where one or more separate circuit modules may be added to an electronic circuit to provide various functions. For example, multiple audio coding circuit board modules may be attached to a base system such that one module supports each channel to be coded. In such an example, power must be supplied to each module, and each module must be individually addressable by the base system for communication purposes. That is, the bus that interconnects each module must have some way of addressing each module individually, such as by an address-based protocol or hardware configuration of the independent modules.

What is desired is a system facilitating connection of multiple non-shared bus devices with a motherboard in a modular stackable configuration that does not require hardware or address configuration to independently address the multiple devices.

SUMMARY OF THE INVENTION

The present invention in one embodiment provides a stackable pass-through signal connector that comprises an array of first connection elements and an array of second connection elements. The second connection elements are physically aligned with the array of first connection elements, and the second connection elements are operable to electrically couple with first connection elements of another stackable non-shared signal connector. Interconnections between the first connection elements and the second connection elements connect first connection elements that are electrically offset from the second connection elements of the stackable non-shared signal connector.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

The present invention addresses the need for a system facilitating connection of multiple non-shared bus devices within and electric circuit, by providing a stackable connector configuration that does not require hardware or address configuration to independently address the multiple devices.

In one embodiment of the invention, a stackable pass-through signal connector has an array of connection elements of a first type and an array of connection elements of a second type. The second connection elements are physically aligned with the array of first connection elements, and the second connection elements are operable to electrically couple with first connection elements of another stackable non-shared signal connector. Interconnections between the first connection elements and the second connection elements connect first connection elements that are electrically offset from the second connection elements of the stackable non-shared signal connector.

Figure 1:
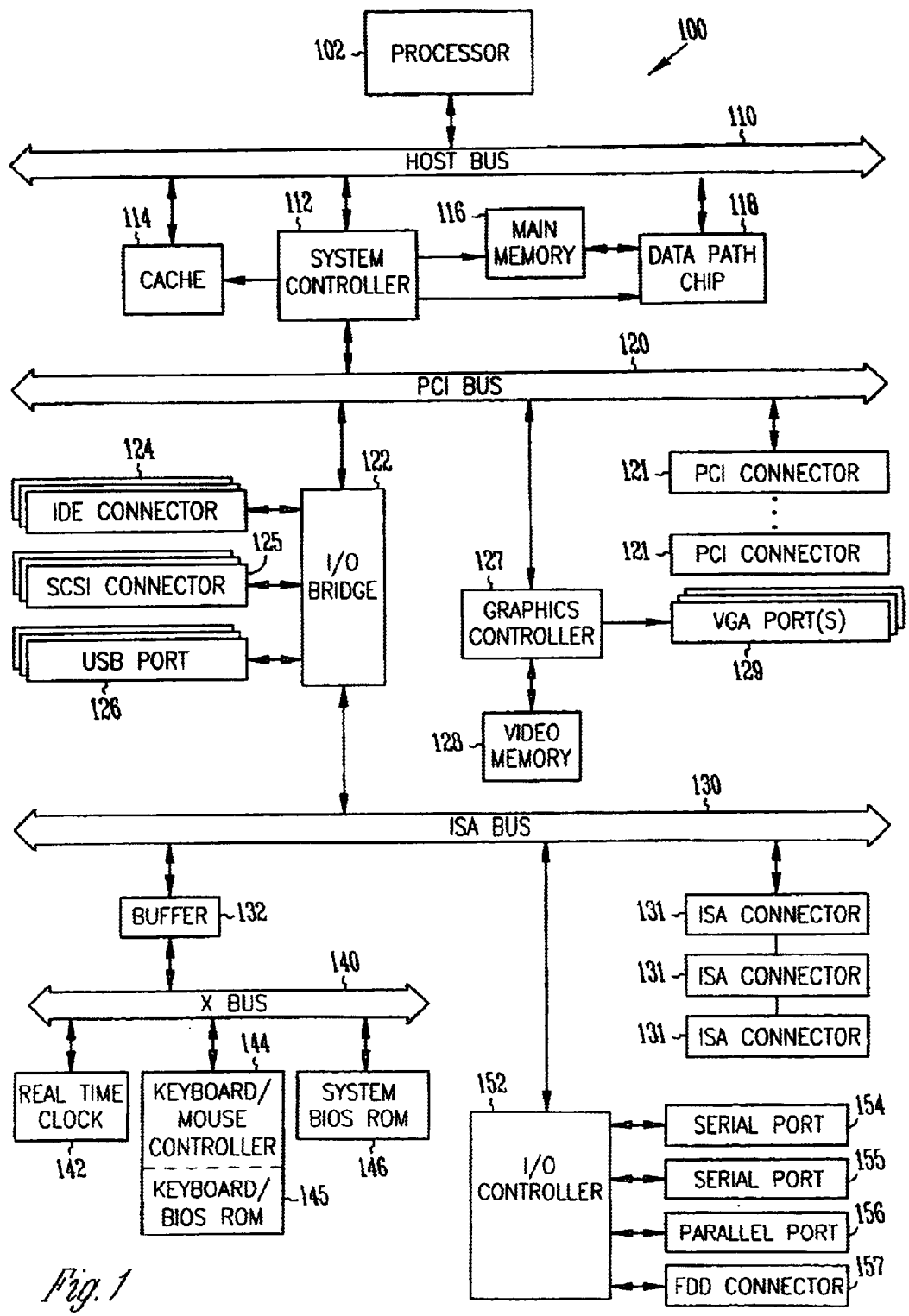
FIG. 1 shows a general purpose computer, as may be used with an embodiment of the present invention.

FIG. 1 illustrates a general-purpose personal computer system 100, such as may be may utilize a stackable bass-through connection system consistent with the present invention. In this embodiment, processor 102, system controller 112, cache 114, and data-path chip 118 are each coupled to host bus 110. Processor 102 is a microprocessor such as a 486-type chip, a Pentium®, Pentium II® or other suitable microprocessor, and operates at a specific frequency. The microprocessor in some embodiments of the invention has a heat sink physically attached to it to provide cooling. Cache 114 provides high-speed local-memory data (in one embodiment, for example, 512 kB of cache memory) for processor 102, and is controlled by system controller 112, which loads cache 114 with data that is expected to be used soon after the data is placed in cache 112. Main memory 116 is coupled between system controller 114 and data-path chip 118, and in one embodiment, provides random-access memory of between 16 MB and 128 MB of data. In one embodiment, main memory 116 is provided on SIMMs (Single In-line Memory Modules), while in another embodiment, main memory 116 is provided on DIMMs (Dual In-line Memory Modules), each of which plugs into suitable sockets provided on a motherboard holding many of the other components shown in FIG. 1. Main memory 116 includes standard DRAM (Dynamic Random-Access Memory), EDO (Extended Data Out) DRAM, SDRAM (Synchronous DRAM), RDRAM (Rambus DRAM), or other suitable memory technology. System controller 112 controls PCI (Peripheral Component Interconnect) bus 120, a local bus for system 100 that provides a high-speed data path between processor 102 and various peripheral devices, such as graphics devices, storage drives, network cabling, etc. Data-path chip 118 is also controlled by system controller 112 to assist in routing data between main memory 116, host bus 110, and PCI bus 120.

In one embodiment, PCI bus 120 provides a 32-bit-wide data path that runs at 33 MHz. In another embodiment, PCI bus 120 provides a 64-bit-wide data path that runs at 33 MHz. In yet other embodiments, PCI bus 120 provides 32-bit-wide or 64-bit-wide data paths that runs at higher speeds. In one embodiment, PCI bus 120 provides connectivity to I/O bridge 122, graphics controller 127, and one or more PCI connectors 121 (i.e., sockets into which a card edge may be inserted), each of which accepts a standard PCI card. In one embodiment, I/O bridge 122 and graphics controller 127 are each integrated on the motherboard along with system controller 112, in order to avoid a board-connector-board signal-crossing interface and thus provide better speed and reliability. In the embodiment shown, graphics controller 127 is coupled to a video memory 128 (that includes memory such as DRAM, EDO DRAM, SDRAM, SGRAM or VRAM (Video Random-Access Memory)), and drives VGA (Video Graphics Adaptor) port 129. VGA port 129 can connect to industry-standard monitors such as VGA-type, SVGA (Super VGA)-type, XGA-type (extended Graphics Adaptor) or SXGA-type (Super XGA) display devices. Other input/output (I/O) cards having a PCI interface can be plugged into PCI connectors 121.

In one embodiment, I/O bridge 122 is a chip that provides connection and control to one or more independent IDE connectors 124–125, to a USB (Universal Serial Bus) port 126, and to ISA (Industry Standard Architecture) bus 130. In this embodiment, IDE connector 124 provides connectivity for up to two standard IDE-type devices such as hard disk drives, CDROM (Compact Disk-Read-Only Memory) drives, DVD (Digital Video Disk) drives, or TBU (Tape-Backup Unit) devices. In one similar embodiment, two IDE connectors 124 are provided, and each provide the EIDE (Enhanced IDE) architecture. In the embodiment shown, SCSI (Small Computer System Interface) connector 125 provides connectivity for up to seven or fifteen SCSI-type devices (depending on the version of SCSI supported by the embodiment). In one embodiment, I/O bridge 122 provides ISA bus 130 having one or more ISA connectors 131 (in one embodiment, three connectors are provided). In one embodiment, ISA bus 130 is coupled to I/O controller 152, which in turn provides connections to two serial ports 154 and 155, parallel port 156, and FDD (Floppy-Disk Drive) connector 157. In one embodiment, ISA bus 130 is connected to buffer 132, which is connected to X bus 140, which provides connections to real-time clock 142, keyboard/mouse controller 144 and keyboard BIOS ROM (Basic Input/Output System Read-Only Memory) 145, and to system BIOS ROM 146.

A PCMCIA card controller (also known as a PC Card controller or CardBus controller) 160 is in one embodiment connected to the PCI bus 120, and is operable to interface the computer 100 to various PCMCIA hardware cards that may be inserted into PCMCIA slots of the computer system. The PCMCIA slots may receive, for example, a wireless data communication card such as a Bluetooth system complaint communication card.

FIG. 1 shows one exemplary embodiment of a computer system that may be used with the present invention, however other configurations, such as varying bus structures and memory arrangements are specifically contemplated and are within the scope of the invention. The computerized system of FIG. 1 may also be implemented in various physical configurations, such as a desktop personal computer, as a server, or as a laptop computer system.

Figure 2:
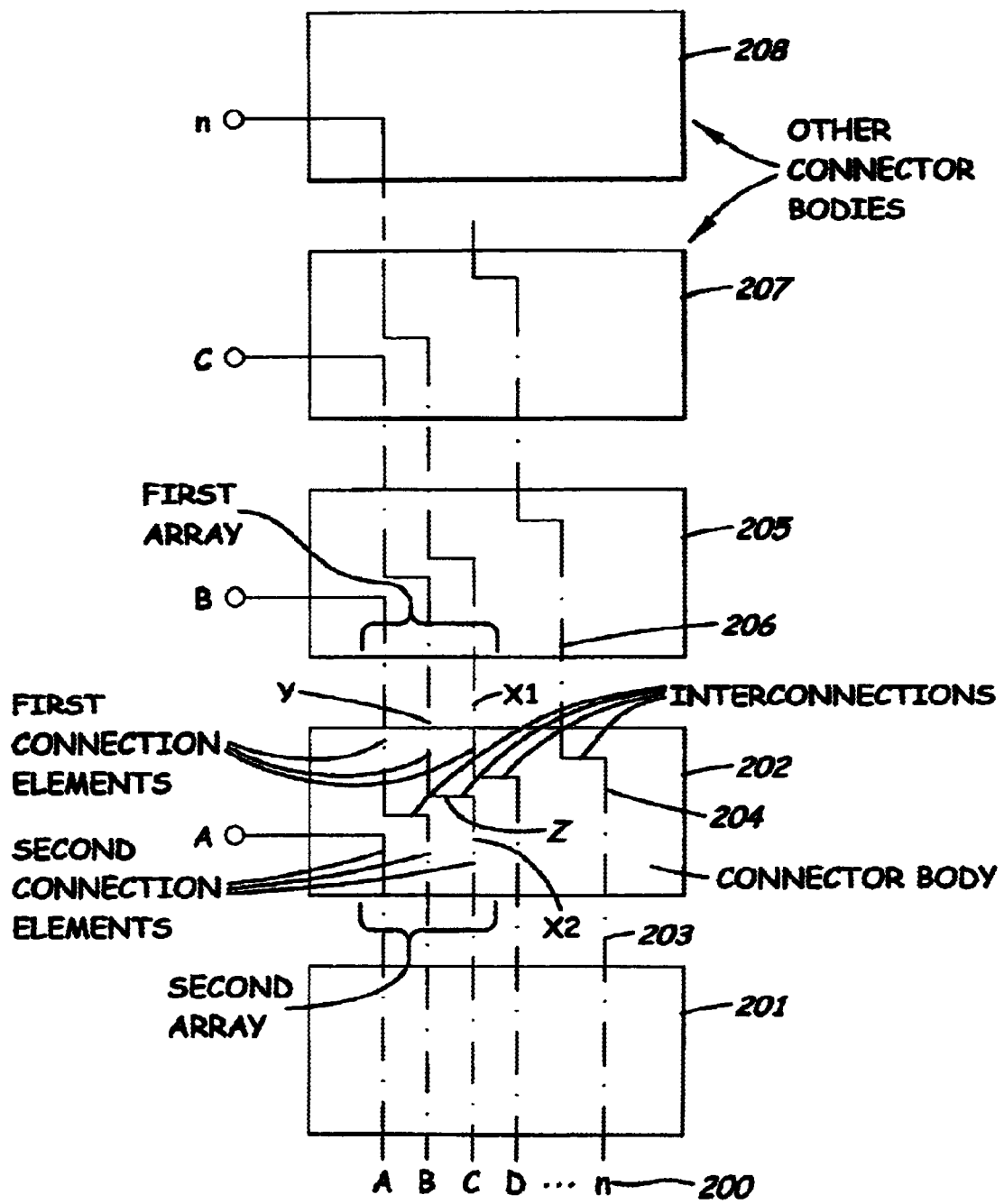
FIG. 2 is a diagram illustrating how an offset stackable non-shared bus signal connector facilitates connection to multiple modules, consistent with an embodiment of the present invention.

FIG. 2 is a cross-view diagram illustrating how a series of stackable pass-through signal connectors with an offset in connection between an array of first connection elements and second connection elements can provide addressability to individual stacked components of a circuit. The base connector or connector body 201 is in this example connected to circuitry having signal connections A–n, as shown at 202. When a first stackable pass-through connector or connector body 202 is connected to 201, electrical connection is made between the connection elements of the two connectors as indicated at 203. The signal "A" is delivered via a circuit board or other connection to a first module and each of the other signals is shifted to an offset position in the connector or connector body 202 as is shown at 204.

An additional connector 205 is similarly connected to connector 202 as indicated at 206, and provides electrical connection between signal "B" from the base connector 201 to a circuit board or other connection to a second module associated with the second connector 205 via the offset electrical connection shown in first connector 202. Similarly, third connector 207 is connected to second connector 205, and provides an electrical connection for signal "C" between a third module and the base connector 201 via the offset electrical connections in first connector 202 and second connector 203.

Connectors can continue to be stacked up to the nth connector shown at 208, which provides a signal connection between signal "n" of the base connector 201 and the nth module attached to the nth connector. When additional connectors are attached to connector n, the connection will in some embodiments of the invention result in a number of offset connections equal to or greater than n between the base and additional connection elements, which will prevent any signals from the base connection from reaching the additional connectors.

Connectors 202 to 208 are in one embodiment of the invention identical physically and electrically, and the conductors are offset by one position within each connector. In other embodiments, a variety of connectors may be employed, and each connector may have a unique structure.

The example embodiment of the present invention shown in FIG. 2 illustrates how a stackable pass-through connector with offset allows discrete electrical connection and addressability of up to n modules via non-shared signal connections or busses, and does so without relying on interrupt or address configuration to provide module addressability.

Figure 3:
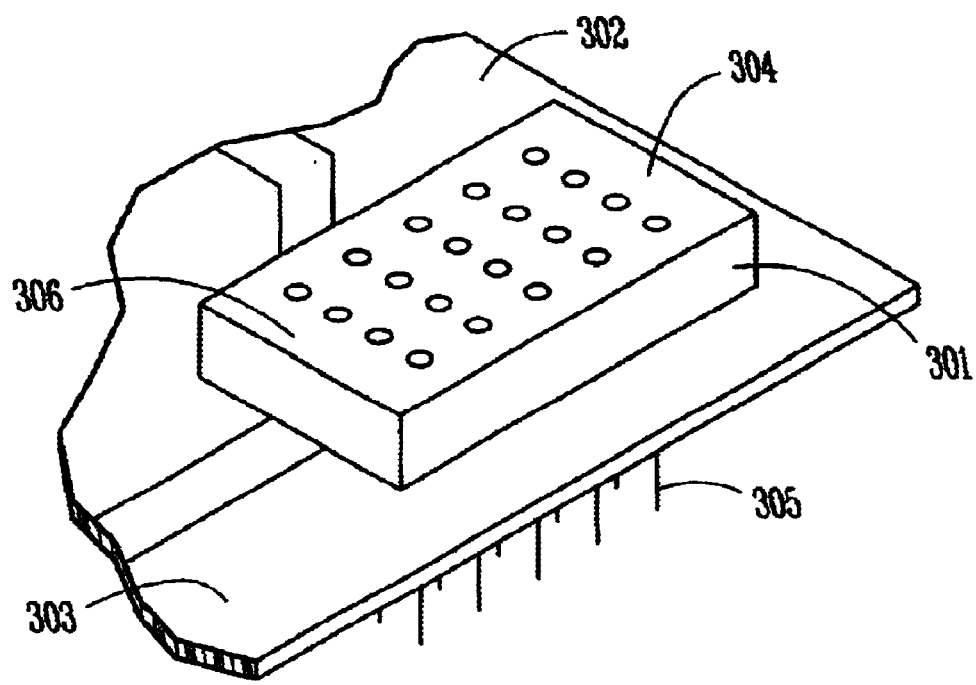
FIG. 3 illustrates an example offset stackable non-shared bus signal connector mounted to a printed circuit board, consistent with an embodiment of the present invention.

FIG. 3 illustrates an example offset stackable pass-through signal connector 301 mounted to a printed circuit board 302, consistent with an embodiment of the present invention. The pass-through stackable connector 301 is electrically connected to an electric circuit on circuit board 302 via printed circuit traces 303, which provide various circuit connections such as data signal and power. Pin sockets 304 are designed to receive pins 305 of another stackable pass-through connector, providing electrical and physical connection between the printed circuit board 302 and other circuit modules. These pin sockets 304 and pins 305 are examples of one type of connection element as may be used to practice the present invention.

The connection elements of connector 301 are soldered to plated-through holes in circuit board 302, which both physically attaches the pass-through connector to the circuit board and electrically connects the connection elements to the various printed circuit traces. In the example connector 301 illustrated in FIG. 3, there are four pins arranged in a column at 306 that provide a group of signals, power, or other connections corresponding to signal bus "A" in FIG. 2. Four other such columns of four pins each exist, providing four additional groups of signals for connectivity to a total of five stackable modules via stacked offset pass-through connectors.

In this example embodiment, two pins of the four-pin column of pins assigned to signal bus "A" at 306 provide power to the stacked modules, while the other two are dedicated to data signal transmission. Other configurations of single or multiple pins per discrete signal or bus connection to other modules are within the scope of the invention, as are other physical configurations of pins, sockets, or other connector elements.

Figure 4:
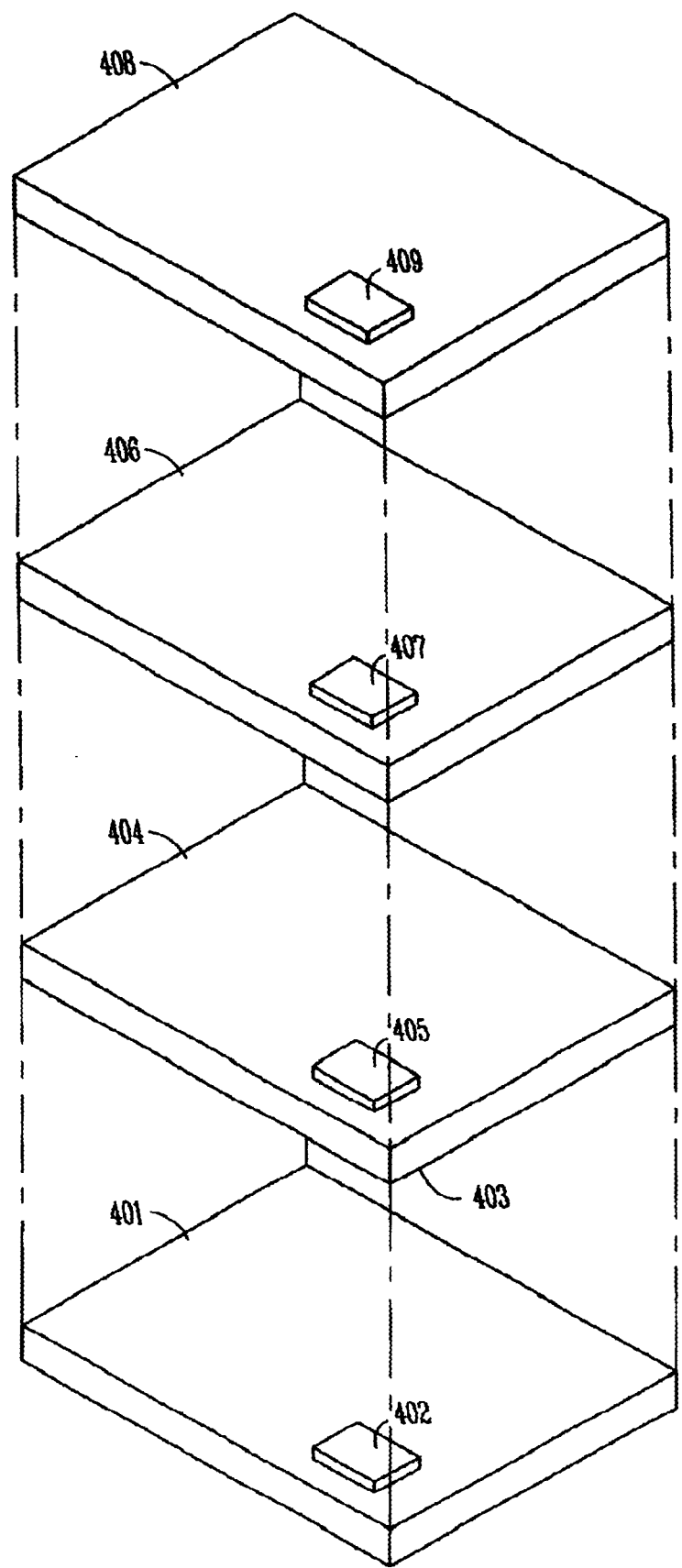
FIG. 4 illustrates connection of multiple electric circuit modules with stackable pass-through signal connectors, consistent with an embodiment of the present invention.

FIG. 4 illustrates how electric circuit modules having stackable pass-through connectors may be connected to provide an offset non-shared bus to various electric circuit modules. A circuit board 401 has a stackable pass-through connector 402, which mates with the bottom portion 403 of a stackable pass-through connector of module 404. The top portion of the connector 403 is shown at 405, which similarly allows connection of module 406 via connector 407. Finally, module 408 is connected via stackable pass-through connector 409. In one embodiment of the invention, the modules 401, 404, 406, and 408 are printed circuit boards, and the connectors 402, 405, 407, and 409 comprise pins on one side and pin sockets on the other side such that the pins and sockets of various modules are mechanically and electrically connectable.

This illustrative example shows how stackable pass-through connectors consistent with the present invention can be used to provide a non-shared signal or bus connection to multiple devices or modules in a modular stackable configuration without requiring hardware or address configuration to independently address the multiple devices. The example embodiments of the invention illustrated in FIGS. 2 and 3, and discussed herein, are designed to show how such example embodiments can be configured consistent with the present invention to provide the function and structure as claimed in the appended claims.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

What is claimed is:

1. A stackable pass-through signal connector, comprising:
   a connector body;
   an array of first connection elements disposed in said body;
   an array of second connection elements disposed in said body, the second connection elements being physically aligned with the first connection elements and the second connection elements being operable to electrically couple with first connection elements of another stackable non-shared signal connector; and
   interconnections disposed within the body of the pass-through signal connector between the first connection elements and the second connection elements of the pass-through connector, the interconnections connecting first connection elements of the pass-through signal connector with second connection elements of the pass-through signal connector that are offset from the first connection elements of the pass-through signal connector perpendicular to a coupling direction of the second connection elements of the pass-through signal connector and the first connection elements of the stackable non-shared signal connector.

2. The stackable pass-through signal connector of claim 1, wherein the first connection elements are pins.

3. The stackable pass-through signal connector of claim 2, wherein the pins are mountable to a printed circuit board such that the pins extend through the printed circuit board and are electrically connected to conductive elements of the printed circuit board.

4. The stackable pass-through signal connector of claim 2, wherein the second connection elements are pin sockets.

5. The stackable pass-through signal connector of claim 1, wherein the connector is mountable to a printed circuit board.

6. The stackable pass-through signal connector of claim 1, wherein the array of first connection elements comprise two or more signal groups, and wherein the offset is a single signal group offset.

7. A method of routing interconnections within a stackable pass-through signal connectors and stacking the connectors, said method comprising:
   interconnecting an array of first connection elements within a first stackable pass-through signal connector with a array of second connection elements within the first pass-through signal connector and in physical alignment with the array of first connection elements so as to provide electrical interconnections between second connection elements and first connection elements that are laterally offset from the second connection elements, the second connection elements being operable to electrically couple with first connection elements of a second stackable non-shared signal connector, and:
   stacking the first and second stackable pass-through signal connectors one on top of the other so that the second connection elements of the first stackable connector are electrically coupled with the first connection elements of the second stackable connector.

8. The method of routing interconnections within a stackable pass-through signal connector of claim 7, wherein the first connection elements are pins.

9. The method of routing interconnections within a stackable pass-through signal connector of claim 8, wherein the pins are mountable to a printed circuit board such that the pins extend through the printed circuit board and are electrically connected to conductive elements of the printed circuit board.

10. The method of routing interconnections within a stackable pass-through signal connector of claim 8, wherein the second connection elements are pin sockets.

11. The method of routing interconnections within a stackable pass-through signal connector of claim 7, wherein the connector is mountable to a printed circuit board.

12. The method of routing interconnection within a stackable pass-through signal connector of claim 7, further comprising:

electrically coupling the signal connector elements to two or more signal groups; and interconnecting the array of first connection elements and second connection elements such that the second connection elements are offset from the corresponding first connection elements by a signal group interval.

13. An electric circuit module, the module comprising:

a circuit board having a plane defined by its two largest dimensions;

a stackable pass-through signal connector electrically connected to the circuit board:

an array of first connection elements comprising a part of the stackable pass-through connector;

an array of second connection elements, the second connection elements comprising a part of the stackable pass-through connector and being physically aligned with the array of first connection elements, the second connection elements being operable to electrically couple with first connection elements of another stackable non-shared signal connector; and interconnections between the first connection elements and the second connection elements within the stackable pass-through connector, the interconnections connecting first connection elements that are offset from the second connection elements of the stackable non-shared signal connector, the offset being in a plane parallel to the plane of the circuit board.

14. The electric circuit module of claim 13, wherein the first connection elements are pins.

15. The electric circuit module of claim 14, wherein the pins are mountable to the printed circuit board such that the pins extend through the printed circuit board and are electrically connected to conductive elements of the printed circuit board.

16. The electric circuit module of claim 14, wherein the second connection elements are pin sockets.

17. The electric circuit module of claim 13, wherein the connector is mountable to a printed circuit board.

18. The electric circuit module of claim 13, further comprising at least one additional electric circuit module, wherein the electric circuit modules are connectable via the stackable pass-through signal connectors.

* * * * *